United States Patent
Lee et al.

(10) Patent No.: US 9,159,433 B2
(45) Date of Patent: Oct. 13, 2015

(54) SEMICONDUCTOR MEMORY DEVICE AND METHOD OF OPERATING THE SAME

(71) Applicant: SK hynix Inc., Icheon-si Gyeonggi-do (KR)

(72) Inventors: Jun Hyuk Lee, Icheon-si (KR); Eun Joung Lee, Cheongju-si (KR); Yoon Soo Jang, Chungcheongbuk-do (KR); Seung Won Kim, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 13/803,788

(22) Filed: Mar. 14, 2013

(65) Prior Publication Data
US 2014/0160846 A1    Jun. 12, 2014

(30) Foreign Application Priority Data

Dec. 11, 2012  (KR) .......................... 10-2012-0143589

(51) Int. Cl.
*G11C 11/34* (2006.01)
*G11C 16/24* (2006.01)

(52) U.S. Cl.
CPC ...................................... *G11C 16/24* (2013.01)

(58) Field of Classification Search
CPC ... G11C 11/4094; G11C 16/26; G11C 11/419
USPC .......................................................... 365/203
See application file for complete search history.

(56) References Cited

U.S. PATENT DOCUMENTS

| | | | |
|---|---|---|---|
| 2006/0152986 A1* | 7/2006 | Gerber ........................... | 365/203 |
| 2007/0014179 A1* | 1/2007 | Hong et al. .............. | 365/230.03 |
| 2012/0099387 A1* | 4/2012 | Shim et al. ................ | 365/189.05 |

FOREIGN PATENT DOCUMENTS

| | | | |
|---|---|---|---|
| KR | 1020100049184 A | | 5/2010 |
| KR | 1020120042415 A | | 5/2012 |

* cited by examiner

*Primary Examiner* — Anthan Tran
(74) *Attorney, Agent, or Firm* — William Park & Associates Ltd.

(57) ABSTRACT

A semiconductor memory device and a method of operating the same are disclosed. The semiconductor memory device includes a memory cell array including memory blocks, a voltage generator configured to generate a precharge voltage; and a read and write circuit coupled to the memory blocks through bit lines, and configured to supply the precharge voltage to the bit lines when a selected memory block is accessed. Here, the precharge voltage varies depending on a distance between the read and write circuit and the selected memory block.

12 Claims, 8 Drawing Sheets

FIG. 4

| selected memory block | voltage of bit lines | |
| --- | --- | --- |
| | memory cell of which programming is inhibited | memory cell to be programmed |
| BLK1 | Vprc1 | Vss |
| BLK2 | Vprc2 | |
| ⋮ | | |
| BLKz | VprcZ | Vss |

Vprc1 < Vprc2 < ... < VprcZ

FIG. 5

| selected memory block | voltage of bit lines |
| --- | --- |
| BLK1 | Vprc1 |
| BLK2 | Vprc2 |
| ⋮ | |
| BLKz | VprcZ |

Vprc1 > Vprc2 > ... > VprcZ

FIG. 6

| selected memory block | memory block group | voltage of bit lines | |
|---|---|---|---|
| | | memory cell of which programming is inhibited | memory cell to be programmed |
| BLK1 | BG1 | Vprc1 | Vss |
| BLK2 | | | |
| BLK3 | BG2 | Vprc2 | |
| BLK4 | | | |
| ⋮ | ⋮ | ⋮ | ⋮ |
| BLKz-1 | BGz/2 | VprcZ/2 | Vss |
| BLKz | | | |

Vprc1 < Vprc2 <...< VprcZ/2

FIG. 7

| selected memory block | memory block group | voltage of bit lines |
|---|---|---|
| BLK1 | BG1 | Vprc1 |
| BLK2 | | |
| BLK3 | BG2 | Vprc2 |
| BLK4 | | |
| ⋮ | ⋮ | ⋮ |
| BLKz-1 | BGz/2 | VprcZ/2 |
| BLKz | | |

Vprc1 > Vprc2 >...> VprcZ/2

FIG. 8

| selected memory block | voltage of word lines | |
|---|---|---|
| | selected word line | unselected word line |
| BLK1 | Vrd1 | Vpass1 |
| BLK2 | Vrd2 | Vpass2 |
| ⋮ | | |
| BLKz | VrdZ | VpassZ |

Vrd1 < Vrd2 <...< VrdZ
Vpass1 < Vpass2 <...< VpassZ

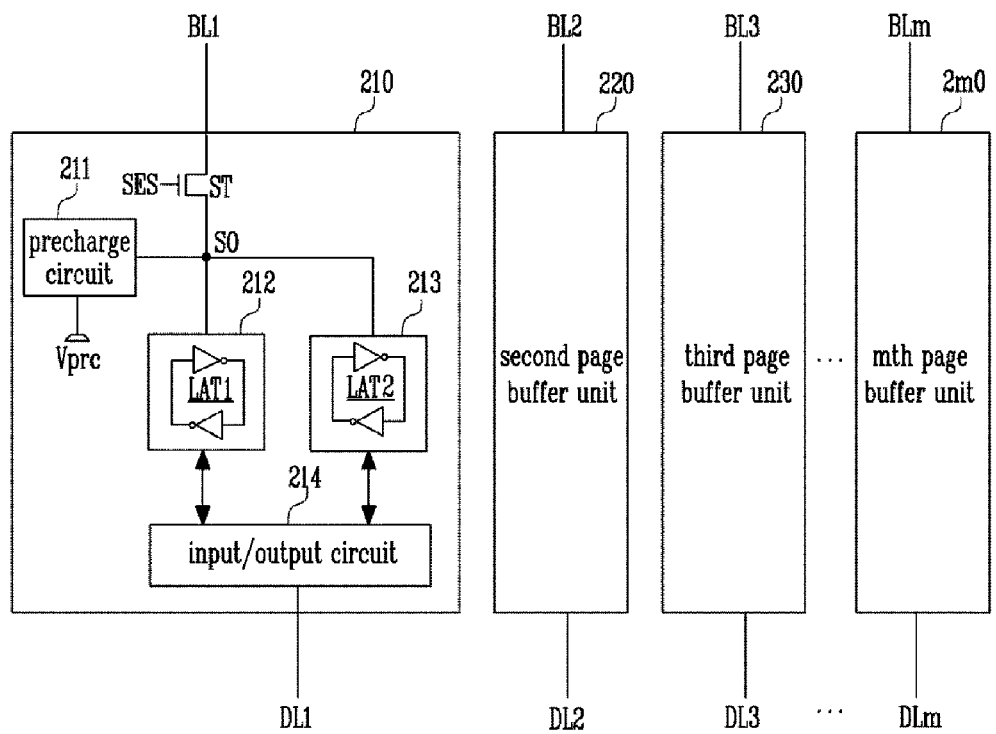

FIG. 11

| selected memory block | evaluation time |
|---|---|
| BLK1 | t1 |
| BLK2 | t2 |
| ⋮ | |
| BLKz | tZ | t1 < t2 < ... < tZ

SEMICONDUCTOR MEMORY DEVICE AND METHOD OF OPERATING THE SAME

CROSS-REFERENCE TO RELATED APPLICATION

This application claims priority from Korean Patent Application No. 10-2012-0143589, filed on Dec. 11, 2012, the contents of which are incorporated herein by reference in its entirety.

BACKGROUND

1. Technical Field

Embodiments of the present invention generally relate to an electronic device, more particularly relate to a semiconductor memory device and a method of operating the same.

2. Related Art

A semiconductor memory may mean a memory device that may be embodied by using a semiconductor such as silicon Si, germanium Ge, gallium arsenide GaAs, indium phospide Inp, etc. The semiconductor memory may be divided into a volatile memory device and a non-volatile memory device.

The volatile memory device may mean a memory device where stored data may become lost if the supply of power is stopped. The volatile memory device may include a static RAM SRAM, a dynamic RAM DRAM, a synchronous DRAM SDRAM and so on. The non-volatile memory device indicates a memory device where stored data remains though power is not being supplied. The non-volatile memory device may include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. The flash memory device may be divided into a NOR-type memory device and a NAND-type memory device.

A size of the semiconductor memory device may reduce gradually. As a result, size of the elements in the semiconductor memory device reduces. For example, as size of a memory cell in the semiconductor memory device reduces, the width of a bit line coupled to the memory cell may reduce as well. Accordingly, disturbance between the elements in the semiconductor memory devices may increase.

SUMMARY OF THE INVENTION

Embodiments of the present invention generally provide for a semiconductor memory device having enhanced reliability and a method of operating the same.

A semiconductor memory device according to an embodiment of the present invention includes a memory cell array including memory blocks; a voltage generator configured to generate a precharge voltage; and a read and write circuit coupled to the memory blocks through bit lines, and configured to supply the precharge voltage to the bit lines when a selected memory block is accessed. Here, the precharge voltage varies depending on distance between the read and write circuit and the selected memory block.

A semiconductor memory device according to an embodiment of the present invention includes a memory cell array including memory blocks, the memory blocks being divided into memory block groups; a voltage generator configured to generate a precharge voltage; and a read and write circuit coupled to the memory blocks through bit lines, and configured to supply the precharge voltage to the bit lines when a selected memory block is accessed. Here, the precharge voltage varies depending on distance between a memory block group including the selected memory block and the read and write circuit.

A method of operating a semiconductor memory device including memory blocks coupled to a read and write circuit through bit lines according to an embodiment of the present invention includes receiving a command an address from an external device; detecting a memory block selected from the memory blocks in response to a block address of the address; generating a precharge voltage determined according to distance between the read and write circuit and the selected memory block; and performing an operation corresponding to the command by supplying the precharge voltage to the bit lines.

In an embodiment of the present invention, a semiconductor memory device having enhanced reliability and a method of operating the same are provided.

BRIEF DESCRIPTION OF THE DRAWINGS

The above and other features and advantages of the present invention will become readily apparent by reference to the following detailed description when considered in conjunction with the accompanying drawings wherein:

FIG. 4 is a view illustrating a table showing voltages supplied to bit lines BL1~BLm in a program operation;

FIG. 5 is a view illustrating a table showing voltages supplied to bit lines BL1~BLm in the read operation;

FIG. 6 is a view illustrating a table showing voltages supplied to bit lines BL1~BLm in the program operation according to an embodiment of the present invention;

FIG. 7 is a view illustrating a table showing voltages supplied to the bit lines BL1~BLm in the read operation according to an embodiment of the present invention;

FIG. 8 is a view illustrating a table showing voltages supplied to word lines in the read operation according to an embodiment of the present invention;

FIG. 9 is a block diagram illustrating the read and write circuit in FIG. 1;

FIG. 10 is a view illustrating a table showing a voltage Vses of a sensing signal SES when respective memory blocks are selected in the read operation; and FIG. 11 is a view illustrating a table showing an evaluation time when respective memory blocks are selected in the read operation.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
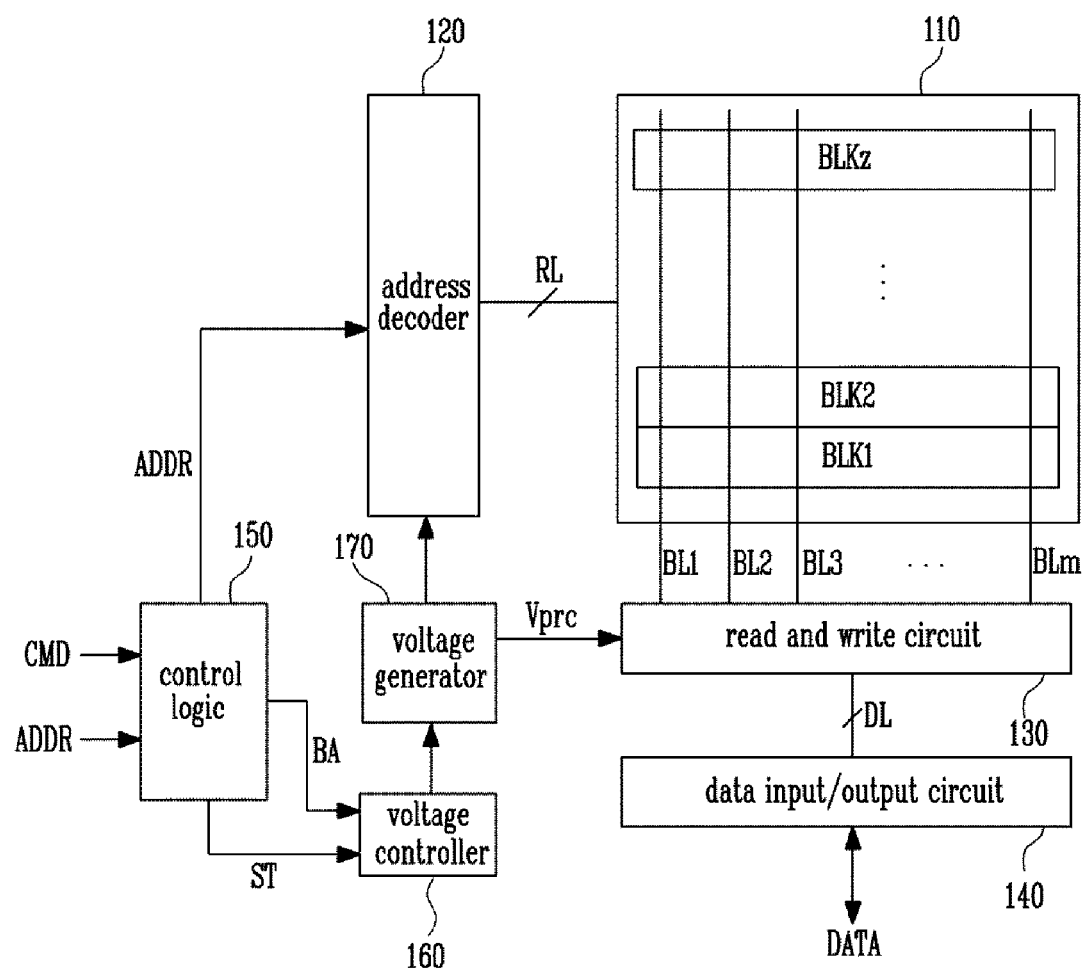
FIG. 1 is a block diagram illustrating a semiconductor memory device according to an embodiment of the present invention.
Figure 2:
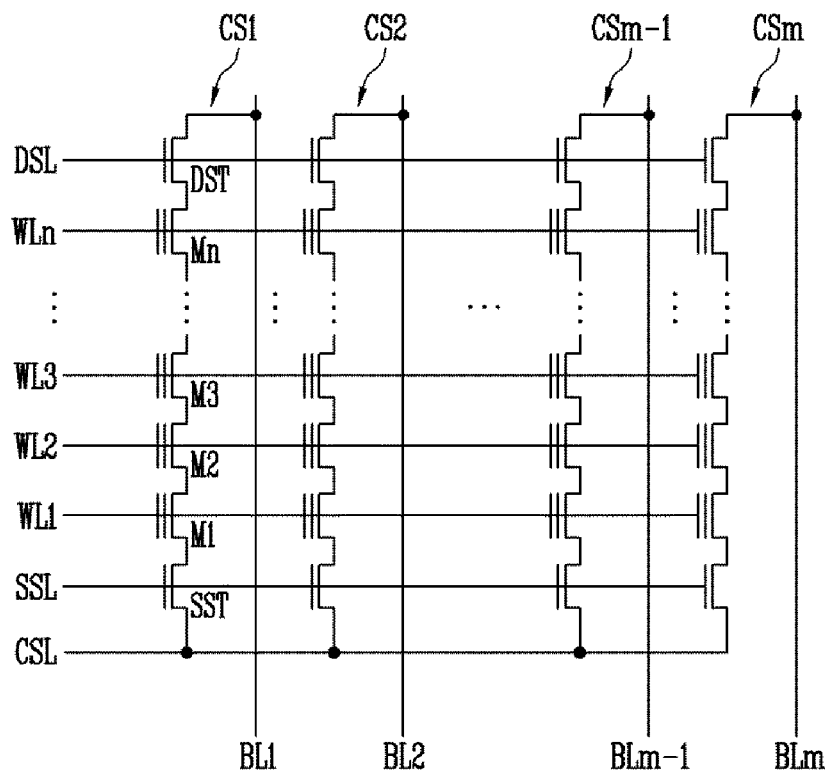
FIG. 2 is a view illustrating one BLK of memory blocks BLK1~BLKz in FIG. 1.

FIG. 1 is a block diagram illustrating a semiconductor memory device according to an embodiment of the present invention. FIG. 2 is a view illustrating one BLK of memory blocks BLK1~BLKz in FIG. 1.

Referring to FIG. 1, the semiconductor memory device 100 of the present embodiments may include a memory cell array 110, an address decoder 120, a read and write circuit 130, a data input/output circuit 140, a control logic 150, a voltage controller 160 and a voltage generator 170. FIG. 2 illustrates one BLK of the memory blocks BLK1~BLKz.

The memory cell array 110 may include the memory blocks BLK1~BLKz. The memory blocks BLK1~BLKz are coupled to the address decoder 120 through row lines RL, and are coupled to the read and write circuit 130 through bit lines BL.

Each of the memory blocks BLK1~BLKz may include memory cells as shown in FIG. 2. In FIG. 2, one memory block BLK may include a first to an mth cell strings CS1~CSm. The first to the mth cell strings CS1~CSm are coupled to a first to an mth bit lines BL1~BLm, respectively. The first to the mth cell strings CS1~CSm are coupled to a common source line CSL, a source select line SSL, a first to an nth word lines WL1~WLn and a drain select line DSL.

Each of the cell strings CS1~CSm may include a source select transistor SST, memory cells M1~Mn coupled in series and a drain select transistor DST. The source select transistor SST is coupled to the source select line SSL. The first to the nth memory cells M1~Mn are coupled to the first to the nth word lines WL1~WLn, respectively. The drain select transistor DST is coupled to the drain select line DSL. The common source line CSL is coupled to a source of the source select transistor SST. Each of bit lines BL1~BLm are coupled to a drain of corresponding drain select transistor DST. The source select line SSL, the first to the nth word lines WL1~WLn and the drain select line DSL are included in the row lines RL in FIG. 1. The source select line SSL, the first to the nth word lines WL1~WLn and the drain select line DSL are driven by the address decoder 120.

In an embodiment, memory cells in the memory block BLK are non-volatile memory cells.

Referring again to FIG. 1, the address decoder 120, the read and write circuit 130, the data input/output circuit 140, the control logic 150, the voltage controller 160 and the voltage generator 170 operate as a peripheral circuit for driving the memory cell array 110.

The address decoder 120 is coupled to the memory cell array 110 through the row lines RL. The address decoder 120 operates in response to control of the control logic 150. The address decoder 120 receives an address ADDR through a global buffer (not shown) in the semiconductor memory device 100. The address decoder 120 selects an accessed region in the memory cell array 110 in response to the address ADDR.

The address decoder 120 decodes a block address of the received address ADDR. The address decoder 120 selects one memory block according to the decoded block address.

The address decoder 120 decodes a row address of the received address ADDR. The address decoder 120 selects one word line of the selected memory block by supplying voltages provided from the voltage generator 170 to the row lines RL, in response to the decoded row address.

A program operation and a read operation of the semiconductor memory device 100 are performed in the unit of a page. The address ADDR in the program operation or the read operation may include the block address and the row address. The address decoder 120 selects one memory block and one word line according to the block address and the row address.

The address decoder 120 may include an address buffer, a block decoder, a row decoder, a column decoder, etc.

The read and write circuit 130 is coupled to the memory cell array 110 through the bit lines BL1~BLm, and is coupled to the data input/output circuit 140 through data lines DL. The read and write circuit 130 operates in response to control of the control logic 150.

The read and write circuit 130 exchanges data with the data input/output circuit 140. In the program operation, the read and write circuit 130 receives data DATA to be programmed through the data input/output circuit 140, stores the received data DATA, and supplies a precharge voltage Vprc or a reference voltage to the bit lines BL1~BLm according to the stored data. That is, the precharge voltage Vprc is supplied to bit lines coupled to memory cells of which programming is inhibited, and the reference voltage is supplied to the bit lines coupled to memory cells to be programmed. Memory cells (hereinafter, referred to as "selected memory cells") coupled to a selected word line are programmed in response to the voltages supplied to the bit lines BL1~BLm.

In the read operation, the read and write circuit 130 precharges the bit lines BL1~BLm to the precharge voltage Vprc, senses voltage change of the bit lines BL1~BLm according to data in selected memory cells when the voltages of the bit lines BL1~BLm are changed (evaluation), and reads the data in the selected memory cells according to the sensed result. The read data DATA is outputted to the data input/output circuit 140.

In an embodiment, the read and write circuit 130 may include page buffers (or page registers), a column select circuit, etc.

The data input/output circuit 140 is coupled to the read and write circuit 130 through the data lines DL. The data input/output circuit 140 operates in response to control of the control logic 150. The data input/output circuit 140 receives the data DATA from the global buffer in the semiconductor memory device 100, and delivers the received data DATA to the read and write circuit 130 through the data lines DL. The data input/output circuit 140 receives the data DATA from the read and write circuit 130 through the data lines DL, and outputs the received data DATA to the global buffer in the semiconductor memory device 100.

The control logic 150 receives a command CMD and the address ADDR through the global buffer in the semiconductor memory device 100. The control logic 150 controls operation of the semiconductor memory device 100 by controlling the address decoder 120, the read and write circuit 130, the data input/output circuit 140, the voltage controller 160 and the voltage generator 170 in response to the command CMD. The control logic 150 delivers the address ADDR to the address decoder 120.

In an embodiment of the present invention, the control logic 150 transmits a state signal ST to the voltage controller 160 in response to the command CMD. The state signal ST indicates an operation to be performed in the semiconductor memory device 100. That is, the state signal ST includes the operation corresponding to the command CMD, for example information concerning a program operation or a read operation. The control logic 150 provides the block address BA of the address ADDR to the voltage controller 160.

The voltage controller 160 controls the voltage generator 170 in response to the state signal ST and the block address BA received from the control logic 150.

It may be assumed that the precharge voltage Vprc has a constant voltage irrespective of selected memory block. If distance between the read and write circuit 130 and the selected memory block is high, the precharge voltage Vprc supplied to the bit line by the read and write circuit 130 in the program operation may not be normally delivered. For example, resistance and capacitance of respective bit lines may increase according as the distance between the read and write circuit 130 and the selected memory block increases. In this case, the precharge voltage Vprc supplied from the read and write circuit 130 to the bit line may not be normally delivered to the selected memory block. Accordingly, reliability of the program operation reduces. This reduction in reliability may increase accordingly as integrity of the memory cell array 110 increases.

Data of the selected memory cell in the read operation may not be normally delivered through the bit lines BL1~BLm, accordingly as the distance between the read and write circuit 130 and the selected memory block increases. In the read operation, the bit lines BL1~BLm are precharged to the precharge voltage Vprc, and then voltages of the precharged bit lines BL1~BLm are reduced or maintained according to the data of the selected memory cell. The precharged voltages may not normally reduce due to the resistance and the capacitance of respective bit lines, accordingly as the distance between the read and write circuit 130 and the selected memory block increases. As a result, reliability of the read operation reduces. The reduction in reliability increases accordingly as the integrity of the memory cell array 110 increases.

In an embodiment, the voltage controller 160 controls the voltage generator 170, to adjust the preacharge voltage Vprc based on the block address BA. The voltage controller 160 may detect the memory block selected from the memory blocks BLK1~BLKz in response to the block address BA. The voltage controller 160 may control the voltage generator 170, to determine the level of the precharge voltage Vprc according to the selected memory block and generates the determined precharge voltage Vprc. That is, the precharge voltage Vprc may be adjusted according to the distance between the read and write circuit 130 and the selected memory block.

The voltage controller 160 may determine the operation to be performed in the semiconductor memory device 100, in response to the state signal ST. In the event that the state signal ST corresponds to the program operation, the voltage controller 160 controls the voltage generator 170, to generate the precharge voltage Vprc having a higher level accordingly as the distance between the read and write circuit 130 and the selected memory block increases. In the event that the state signal ST corresponds to the read operation, the voltage controller 160 may control the voltage generator 170, to generate the precharge voltage Vprc having lower level accordingly as the distance between the read and write circuit 130 and the selected memory block increases.

The voltage generator 170 operates in response to control of the voltage controller 160. The voltage generator 170 may generate the precharge voltage Vprc and voltages by using an external supply voltage supplied to the semiconductor memory device 100. The precharge voltage Vprc generated by the voltage generator 170 may be supplied to the read and write circuit 130.

The voltage generator 170 may generate voltages using the external supply voltage or an internal supply voltage. For example, the voltage generator 170 may include pumping capacitors for receiving the internal supply voltage and generate the voltages by activating selectively the pumping capacitors in response to control of the control logic 150. The generated voltages are supplied to a word line by the address decoder 120. The voltage controller 160 may adjust the voltages supplied to the address decoder 120 according to the selected memory block in the read operation. This will be described in detail with reference to accompanying Figure FIG. 8.

In an embodiment of the present invention, the precharge voltage Vprc supplied to the bit line varies depending on the distance between the read and write circuit 130 and the selected memory block. The semiconductor memory device 100 may stably operate irrespective of the distance between the read and write circuit 130 and the selected memory block. Accordingly, the semiconductor memory device 100 having enhanced reliability is provided.

Figure 3:
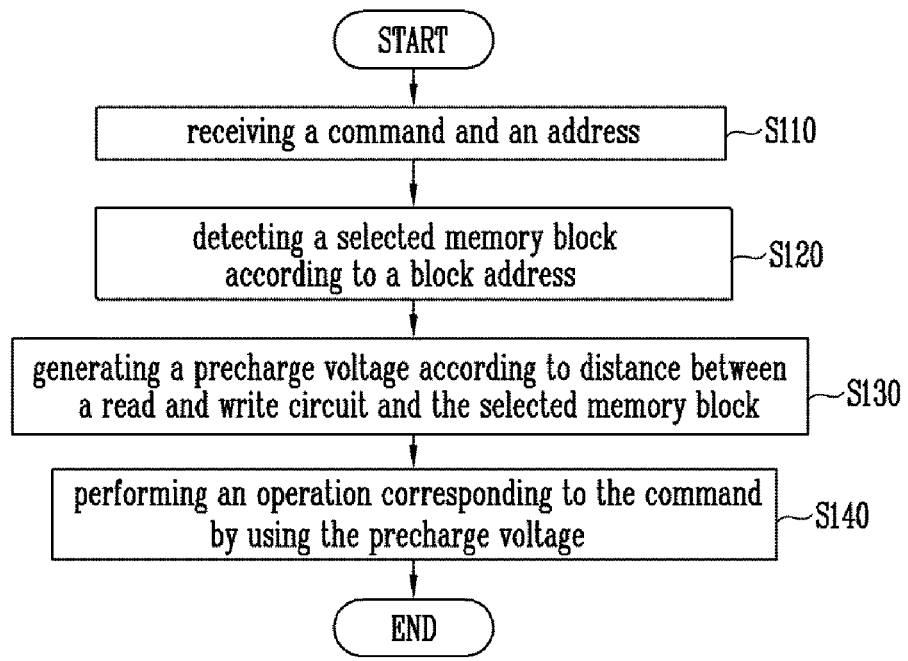
FIG. 3 is a flowchart illustrating operation of a semiconductor memory device according to an embodiment of the present invention.

FIG. 3 is a flowchart illustrating operation of a semiconductor memory device according to an embodiment of the present invention.

Referring to FIG. 1 and FIG. 3, the command CMD and the address ADDR are received in step S110. In step S120, the selected memory block is detected according to the block address BA of the received address ADDR, and the voltage controller 160 detects the selected memory block in response to the block address BA received from the control logic 150.

In step S130, the precharge voltage Vprc is determined and generated according to the distance between the read and write circuit 130 and the selected memory block. In the event that the state signal ST corresponding to the program operation is received from the control logic 150, the voltage controller 160 may control the voltage generator 170, to generate the precharge voltage Vprc having a higher level accordingly as the distance between the read and write circuit 130 and the selected memory block increases. When the state signal ST corresponding to the read operation is received from the control logic 150, the voltage controller 160 may control the voltage generator 170, to generate the precharge voltage Vprc having a lower level accordingly as the distance between the read and write circuit 130 and the selected memory block increases.

In step S140, an operation corresponding to the command CMD may be performed by using the precharge voltage Vprc.

FIG. 4 is a view illustrating a table showing voltages supplied to bit lines BL1~BLm (see FIG. 1) in a program operation.

Referring to FIG. 1 and FIG. 4, the precharge voltage Vprc used when each memory block is selected may differ. A first precharge voltage Vprc1 may be supplied to bit lines coupled to memory cells of which programming is inhibited, when a first memory block BLK1 is selected. A second precharge voltage Vprc2 may be supplied to bit lines coupled to memory cells of which programming is inhibited, when a second memory block BLK2 is selected. A Zth precharge voltage VprcZ may be supplied to bit lines coupled to memory cells of which programming is inhibited, when a zth memory block BLKz is selected. A reference voltage Vss, e.g. a ground voltage may be supplied to bit lines coupled to memory cells to be programmed. The first to the Zth precharge voltages Vprc1~VprcZ may increase sequentially (i.e., Vprc1<Vprc2< ... <VprcZ).

That is, the precharge voltage Vprc having a higher level may be used accordingly as the distance between the read and write circuit 130 and the selected memory block increases. For example, the first precharge voltage Vprc1 of approximately 2V may be used when the memory block BLK1 is selected, the memory block BLK1 being nearest from the read and write circuit 130. The Zth precharge voltage VprcZ of approximately 3V may be used when the memory block BLKz is selected, the memory block BLKz being farthest from the read and write circuit 130.

FIG. 5 is a view illustrating a table showing voltages supplied to bit lines BL1~BLm in the read operation.

Referring to FIG. 1 and FIG. 5, the first to the Zth precharge voltages Vprc1~VprcZ (i.e., voltage of bit lines) may be used when the first to the zth memory blocks BLK1~BLKz are selected, respectively. Here, the first to the Zth precharge voltages Vprc1~VprcZ reduce sequentially (i.e., Vprc1>Vprc2> ... >VprcZ).

That is, the precharge voltage Vprc having a lower level may be used accordingly as the distance between the read and write circuit 130 and the selected memory block increases. For example, the first precharge voltage Vprc1 of approximately 3V may be used when the memory block BLK1 nearest from the read and write circuit 130 is selected, and the Zth precharge voltage VprcZ of 2V may be used when the memory block BLKz farthest from the read and write circuit 130 is selected.

FIG. 6 is a view illustrating a table showing voltages supplied to bit lines BL1~BLm in the program operation according to an embodiment of the present invention.

Referring to FIG. 1 and FIG. 6, the first to the zth memory blocks BLK1~BLKz are divided into memory block groups BG1~BGz/2, and a different precharge voltage Vprc may be used when a memory block group including an accessed memory block differ. FIG. 6 illustrates one memory block group including two memory blocks.

A first precharge voltage Vprc1 may be supplied to bit lines coupled to memory cells of which programming is inhibited, when the first memory block BLK1 or a second memory block BLK2 is selected. A second precharge voltage Vprc2 may be supplied to the bit lines coupled to the memory cells of which programming of inhibited, when a third memory block BLK3 or a fourth memory block BLK4 is selected. A (Z/2) precharge voltage VprcZ/2 may be supplied to the bit lines coupled to the memory cells of which programming is inhibited, when a (z−1)th memory block BLKz−1 or the zth memory block BLKz is selected. A reference voltage Vss may be supplied to the bit lines coupled to the memory cells to be programmed. The first to the Z/2 precharge voltages Vprc1~VprcZ/2 increase sequentially (i.e., Vprc1< Vprc2< ... <VprcZ/2).

FIG. 7 is a view illustrating a table showing voltages supplied to the bit lines BL1~BLm in the read operation according to an embodiment of the present invention.

Referring to FIG. 1 and FIG. 7, the bit lines BL1~BLm may be precharged to a first precharge voltage Vprc1, when the first memory block BLK1 or the second memory block BLKz is selected. The bit lines BL1~BLm may be precharged to a second precharge voltage Vprc2, when the third memory block BLK3 or the fourth memory block BLK4 is selected. The bit lines BL1~BLm may be precharged to a Z/2 precharge voltage VprcZ/2, when a (z−1)th memory block BLKz−1 or a zth memory block BLKz is selected. The first to the Zth precharge voltages Vprc1~VprcZ/2 reduce sequentially (i.e., Vprc1>Vprc2> ... >VprcZ/2).

In an embodiment of the present invention, the precharge voltage Vprc may vary depending on the distance between the memory block group including the selected memory block and the read and write circuit 130. Accordingly, the present invention may provide the semiconductor memory device 100 having enhanced reliability.

Hereinafter, it is assumed that one memory block group includes one memory block, for convenience of description.

FIG. 8 is a view illustrating a table showing voltages supplied to word lines in the read operation according to an embodiment of the present invention.

Referring to FIG. 1, FIG. 2 and FIG. 8, different read voltages Vrd may be used when different memory blocks are selected. Here, the read voltage Vrd may mean a voltage supplied to a word line selected from word lines WL1~WLn in the read operation. Different read pass voltages Vpass may be used when different memory blocks are selected. The read pass voltage Vpass may mean a voltage supplied to unselected word lines of the word lines WL1~WLn in the read operation. The read voltage Vrd and the read pass voltage Vpass may be generated from the voltage generator 170.

If the read operation begins, the bit lines BL1~BLm may be precharged. The pass voltage Vpass having a high voltage may be supplied to the unselected word lines, e.g. WL2~WLn. Memory cells coupled to the unselected word lines may be turned on irrespective of their threshold voltages. The read voltage Vrd having a low voltage may be supplied to the selected word line, e.g. WL1. The selected memory cells may be turned on or turned off depending on their threshold voltages. The reference voltage may be supplied to the common source line CSL.

The supply voltage may be supplied to the drain select line DSL and the source select line SSL. As a result, the select transistors DST and SST may be turned on. Accordingly, electric charges precharged to the bit lines BL1~BLm may be discharged to the common source line CSL according to the threshold voltages of the selected memory cells, and so voltages of the bit lines BL1~BLm may change. The read and write circuit 130 senses the voltages of the bit lines BL1~BLm, and detects data of the selected memory cells according to the sensed result.

It is assumed that the distance between the read and write circuit 130 and the selected memory block is high. The voltages of the bit lines BL1~BLm may not reduce smoothly due to capacitance or resistance of the bit lines BL1~BLm, though the electric charges precharged to the bit lines BL1~BLm are discharged to the common source line CSL.

In an embodiment of the present invention, the read voltage Vrd increases accordingly as the distance between the read and write circuit 130 and the selected memory block increases. The read pass voltage Vpass increases accordingly as the distance between the read and write circuit 130 and the selected memory block increases. The electric charges precharged to the bit lines BL1~BLm may be smoothly discharged to the common source line CSL, in the event that the distance between the read and write circuit 130 and the selected memory block increases.

When the first memory block BLK1 is selected, a first read voltage Vrd1 may be supplied to the selected word line, and a first read pass voltage Vpass1 may be supplied to the unselected word line. When the second memory block BLK2 is selected, a second read voltage Vrd2 may be supplied to the selected word line, and a second read pass voltage Vpass2 may be supplied to the unselected word line. When the zth memory block BLKz is selected, a Zth read voltage VrdZ may be supplied to the selected word line, and a Zth read pass voltage VpassZ may be supplied to the unselected word line. The first to the Zth read voltages Vrd1~VrdZ may increase sequentially (i.e., Vrd1<Vrd2<...<VrdZ), and also the first to the Zth read pass voltages Vpass1~VpassZ may increase in sequence (i.e., Vpass1<Vpass2<...<VpassZ).

In an embodiment of the present invention, the voltages supplied to the word lines WL1~WLn may be adjusted according to the distance between the read and write circuit 130 and the selected memory block. Accordingly, the present invention may provide the semiconductor memory device 100 with enhanced reliability.

FIG. 9 is a block diagram illustrating the read and write circuit in FIG. 1.

In FIG. 9, the read and write circuit 130 may include a first to mth page buffer units 210~2m0. FIG. 9 omits elements in a second to the mth page buffer units 220~2m0 for convenience of description. However, the second to the mth page buffer units 220~2m0 may be substantially the same as in the first page buffer unit 210.

The first page buffer unit 210 may include a sensing transistor ST, a precharge circuit 211, a first latch unit 212, a second latch unit 213 and an input/output circuit 214.

The sensing transistor ST may be coupled between a first bit line BL1 and a sensing node SO, and may turn on in response to a sensing signal SES. The sensing signal SES may be received from the control logic 150. The precharge circuit 211 may be coupled to the sensing node SO.

The first and the second latch units 212 and 213 may be coupled between the sensing node SO and the input/output circuit 214. The first page buffer 210 may include three or more latch units. The input/output circuit 214 may be coupled between the first and the second latch units 212 and 213 and a first data line DL1.

If the read operation begins, the precharge circuit 211 may precharge the sensing node SO to the precharge voltage Vprc. In this time, the sensing signal SES may be activated, and thus the first bit line BL1 may be precharged to the precharge voltage Vprc.

The sensing signal SES may be inactivated when a voltage of the first bit line BL1 reaches the precharge voltage Vprc. The select transistors (DST and SST in FIG. 2) may be turned on and the voltage of the first bit line BL1 may be changed in response to data stored in the selected memory cell, during the evaluation time. The sensing signal SES may be again activated after the evaluation time is elapsed. In the event that the voltage of the first bit line BL1 is smaller than the difference between a voltage of the sensing signal SES and a threshold voltage Vth of the sensing transistor ST, the sensing transistor ST may be turned on and the voltage of the sensing node SO changes according to the voltage of the first bit line BL1. In the event that the voltage of the first bit line BL1 is higher than the difference between the voltage of the sensing signal SES and the threshold voltage Vth of the sensing transistor ST, the sensing transistor ST may be turned off and the voltage of the sensing node SO is maintained. Data may be stored in one of the first and the second latch units 212 and 213, according to the voltage of the sensing node SO.

The voltages of the bit lines BL1~BLm may not reduce smoothly if the distance between the read and write circuit (130 in FIG. 1) and the selected memory block is high, though the electric charges precharged to the bit lines BL1~BLm are discharged to the common source line CSL. That is, the voltages of the bit lines BL1~BLm may be higher than an expected voltage.

In an embodiment of the present invention, the voltage of the sensing signal SES may increase accordingly as the distance between the read and write circuit 130 and the selected memory block increases. Accordingly, the sensing transistor ST may be turned on, though the voltages of the bit lines BL1~BLm may not reduce smoothly. This will be described in detail with reference to accompanying Figure FIG. 10.

In an embodiment of the present invention, an evaluation time may increase accordingly as the distance between the read and write circuit 130 and the selected memory block increases. Accordingly, the voltages of the bit lines BL1~BLm may be smoothly changed during increased evaluation time. This will be described in detail with reference to accompanying Figure FIG. 11.

FIG. 10 is a view illustrating a table showing a voltage Vses of a sensing signal SES when respective memory blocks are selected in the read operation.

Referring to FIG. 1 and FIG. 10, the sensing signal SES has a first to a zth voltages Vses1~VsesZ when the first to the zth memory blocks BLK1~BLKz are selected, respectively. The first to the Zth voltages Vses1~VsesZ of the sensing signal SES may increase sequentially (i.e., Vses1<Vses2<...<VsesZ).

The sensing signal SES may be provided from the control logic 150. In an embodiment, the voltage controller 160 may determine the voltage level of the sensing signal SES based on the stage signal ST and the block address BA, and transmit the determined voltage level to the control logic 150. The control logic 150 may transmit the sensing signal SES having the determined voltage level to the read and write circuit 130.

It may be understood that the embodiment in FIG. 5 and the embodiment in FIG. 10 may be variously combined. In an embodiment, the precharge voltage Vprc may reduce and the voltage Vses of the sensing signal SES may be maintained, accordingly, as the distance between the read and write circuit 130 and the selected memory block increases. In an embodiment, the precharge voltage Vprc may be maintained and the voltage Vses of the sensing signal SES may increases, accordingly, as the distance between the read and write circuit 130 and the selected memory block increases. In an embodiment, the precharge voltage Vprc may reduce and the voltage Vses of the sensing signal SES may increase, accordingly, as the distance between the read and write circuit 130 and the selected memory block increases. That is, the difference between the precharge voltage Vprc and the voltage Vses of the sensing signal SES may reduce according as the distance between the read and write circuit 130 and the selected memory block increases.

FIG. 11 is a view illustrating a table showing an evaluation time when respective memory blocks are selected in the read operation.

Referring to FIG. 1 and FIG. 11, a first to a Zth evaluation time t1~tZ may be provided, when the first to the zth memory blocks BLK1~BLKz are selected, respectively. The first to the Zth evaluation time t1~tZ may increase sequentially (i.e., t1<t2<...<tZ). That is, an evaluation time may be shortest when the first memory block BLK1 nearest to the read and write circuit 130 is selected, and an evaluation time may be longest when the zth memory block BLKz farthest from the read and write circuit 130 is selected.

The evaluation time may be controlled by the control logic 150. In an embodiment, the voltage controller 160 may determine the evaluation time based on the state signal ST and the block address BA, and transmit the determined evaluation time to the control logic 150. The control logic 150 may control the address decoder 120, to turn on the select transistors (SST and DST in FIG. 2) during the determined evaluation time.

Figure 12:
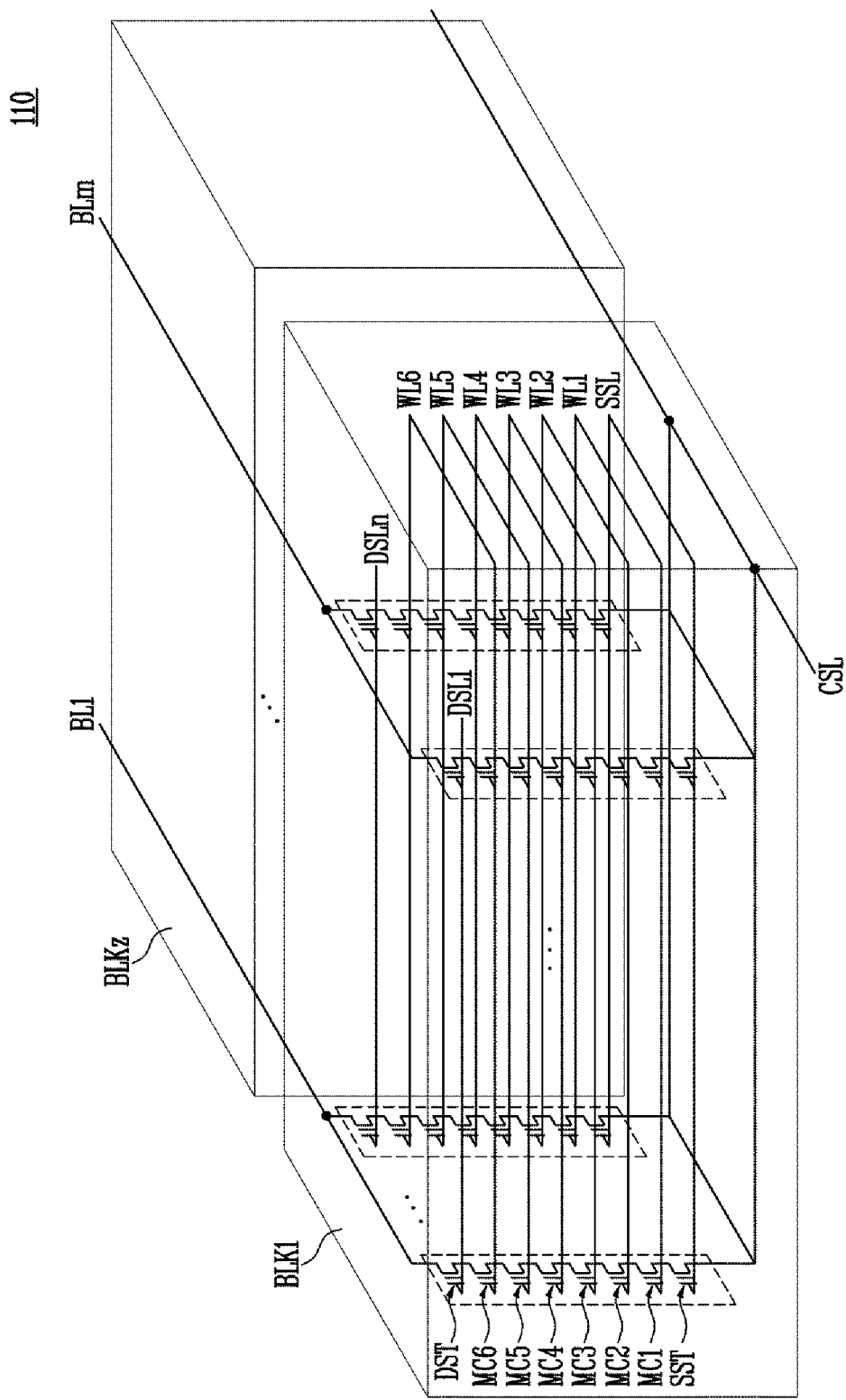
FIG. 12 is a detailed block diagram illustrating memory blocks BLK1 through BLKz of FIG. 1 according to another embodiment of an inventive concept.

FIG. 12 is a detailed block diagram illustrating memory blocks BLK1 through BLKz of FIG. 1 according to another embodiment of an inventive concept of the present application.

Referring to FIG. 12, the memory blocks BLK1 through BLKz are commonly coupled to bit lines BL1 through BLm. As a description regarding FIG. 1, the bit lines BL1 through BLm are coupled to the read and write circuit 130.

In FIG. 12, for ease of illustration, an equivalent circuit of a first memory block BLK1 is illustrated in detail. However, like the first memory block BLK1, the remaining memory blocks BLK2 through BLKz may be configured the same as illustrated in FIG. 2.

The memory block BLK1 may be coupled to bit lines BL1 through BLm. The memory block BLK1 may be coupled to drain select lines DSL1 through DSLn, first through sixth word lines WL1 through WL6, a source select line SSL, and a common source line CSL.

The memory block BLK1 may include a plurality of cell strings. Each cell string may include a source select transistor SST, first through sixth memory cells MC1 through MC6, and a drain select transistor DST.

A gate (or, a control gate) of a drain select transistor DST may be connected to a corresponding drain select line and between a corresponding bit line and the sixth memory cell MC6.

The first through sixth memory cells MC1 through MC6 may be connected in series, and may be connected between the drain select transistor DST and a source select transistor SST. Gates (or, control gates) of the first through sixth memory cells MC1 through MC6 may be connected to first through sixth word lines WL1 through WL6, respectively.

The source select transistor SST may be connected between the sixth memory cell MC6 and the common source line CSL. A gate (or, a control gate) of the source select transistor SST may be connected to the ground selection line SSL.

The inventive concept of the present application may cover a three-dimensional semiconductor memory device which comprises the memory cell array illustrating in FIG. 12. The precharge voltage Vprc may vary depending on a distance between the read and write circuit 130 and a selected memory block in a read operation or a program operation as described above. Furthermore, the read voltage Vrd, the read pass voltage Vpass, evaluation time and the sensing signal SES during the read operation may be controlled according to the distance between the read and write circuit 130 and the selected memory block.

The memory cell array 110 illustrated in FIG. 12 may be exemplary embodiment, and the inventive concept is not limited thereto. For example, each cell string can include 7 or more memory cells and include at least one dummy memory cell.

It is understood that various manners of 3-Dimensional structures may be used to provide the equivalent circuit of the memory blocks BLK1 through BLKz illustrated in FIG. 12.

Although various embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
a memory cell array including memory blocks;
a voltage generator configured to generate a precharge voltage; and
a read and write circuit coupled to the memory blocks through bit lines, and configured to supply the precharge voltage to the bit line when a selected memory block is accessed,
wherein the precharge voltage varies depending on a distance between the read and write circuit and the selected memory block,
wherein the precharge voltage increases as the distance between the read and write circuit and the selected memory block increases, when a program operation is performed.

2. The semiconductor memory device of claim 1, further comprising:
a voltage controller configured to control the voltage generator to adjust the precharge voltage based on a block address,
wherein the selected memory block is determined according to the block address.

3. A semiconductor memory device comprising:
a memory cell array including memory blocks;
a voltage generator configured to generate a precharge voltage;
a read and write circuit coupled to the memory blocks through bit lines, and configured to supply the precharge voltage to the bit lines when a selected memory block is accessed;
a voltage controller configured to control the voltage generator so that the precharge voltage varies depending on a distance between the read and write circuit and the selected memory block; and
an address decoder coupled to the memory blocks through word lines,
wherein the voltage generator generates further a read voltage and a read pass voltage in the read operation,
wherein the address decoder applies the read voltage to a word line selected from word lines coupled to the selected memory block and applies the read pass voltage to an unselected word line of the word lines coupled to the selected memory block, and
wherein the read voltage increases as the distance between the read and write circuit and the selected memory block increases, when the read operation is performed.

4. A semiconductor memory device comprising:
a memory cell array including memory blocks;
a voltage generator configured to generate a precharge voltage;
a read and write circuit coupled to the memory blocks through bit lines, and configured to supply the precharge voltage to the bit lines when a selected memory block is accessed;
a voltage controller configured to control the voltage generator so that the precharge voltage varies depending on a distance between the read and write circuit and the selected memory block; and
an address decoder coupled to the memory blocks through word lines,
wherein the voltage generator generates further a read voltage and a read pass voltage in the read operation,
wherein the address decoder applies the read voltage to a word line selected from word lines coupled to the selected memory block and applies the read pass voltage to an unselected word line of the word lines coupled to the selected memory block, and
wherein the read pass voltage increases as the distance between the read and write circuit and the selected memory block increases, when the read operation is performed.

5. The semiconductor memory device of claim 4, wherein voltages of the bit lines vary depending on data stored in selected memory cells of the selected memory block during an evaluation time, after the precharge voltage supplied to the bit line is blocked, and the read and write circuit detects the data stored in the selected memory cells by sensing the voltages of the bit lines, after the evaluation time is elapsed.

6. The semiconductor memory device of claim 5, wherein the evaluation time increases as the distance between the read and write circuit and the selected memory block increases.

7. The semiconductor memory device of claim 5, wherein the read and write circuit further includes:

sensing transistors coupled between the bit lines and sensing nodes and configured to be turned on when a sensing signal is activated; and latch units configured to detect the data stored in the selected memory cells according to voltages of the sensing nodes, and store the detected data, and wherein a voltage of the activated sensing signal increases as the distance between the read and write circuit and the selected memory block increases.

8. A semiconductor memory device comprising:

a memory cell array including memory blocks, the memory blocks being divided into memory block groups;

a voltage generator configured to generate a precharge voltage; and a read and write circuit coupled to the memory blocks through bit lines, and configured to supply the precharge voltage to the bit lines when a selected memory block is accessed, wherein the precharge voltage varies depending on distance between a memory block group including the selected memory block and the read and write circuit, wherein the precharge voltage increases as the distance between the memory block group including the selected memory block and the read and write circuit increases, when a program operation is performed.

9. A semiconductor memory device comprising:

a memory cell array including memory blocks, the memory blocks being divided into memory block groups;

a voltage generator configured to generate a precharge voltage; and a read and write circuit coupled to the memory blocks through bit lines, and configured to supply the precharge voltage to the bit lines when a selected memory block is accessed;

a voltage controller configured to control the voltage generator so that the precharge voltage varies depending on distance between a memory block group including the selected memory block and the read and write circuit; and an address decoder coupled to the memory blocks through word lines, wherein the voltage generator generates further a read voltage and a read pass voltage in the read operation, wherein the address decoder applies the read voltage to a word line selected from word lines coupled to the selected memory block and applies the read pass voltage to an unselected word line of the word lines coupled to the selected memory block, and wherein the read voltage increases as the distance between the memory block group including the selected memory block and the read and write circuit increases, when the read operation is performed.

10. The semiconductor memory device of claim 9, wherein the read pass voltage increases as the distance between the memory block group including the selected memory block and the read and write circuit increases, when the read operation is performed.

11. A method of operating a semiconductor memory device including memory blocks coupled to a read and write circuit through bit lines, the method comprising:

receiving a command an address from an external device;

detecting a memory block selected from the memory blocks in response to a block address of the address;

generating a precharge voltage determined according to distance between the read and write circuit and the selected memory block; and performing an operation corresponding to the command by supplying the precharge voltage to the bit lines, wherein the command corresponds to a program operation, and the precharge voltage increases as the distance between the read and write circuit and the selected memory block increases.

12. A method of operating a semiconductor memory device including memory blocks coupled to a read and write circuit through bit lines and a voltage generator, the method comprising:

receiving a command an address from an external device;

detecting a memory block selected from the memory blocks in response to a block address of the address;

generating a precharge voltage using the voltage generator, the precharge voltage being determined according to distance between the read and write circuit and the selected memory block;

generating a read voltage and a read pass voltage; and performing an operation corresponding to the command by supplying the precharge voltage to the bit lines, wherein the read voltage is applied to a word line selected from word lines coupled to the selected memory block and the read pass voltage is applied to unselected word line of the word lines coupled to the selected memory block, when the operation corresponding to the command is performed, and the read voltage and the read pass voltage increase as the distance between the read and write circuit and the selected memory block increases.

\* \* \* \* \*